United States Patent
Sachan et al.

(10) Patent No.: US 8,031,541 B1
(45) Date of Patent: Oct. 4, 2011

(54) LOW LEAKAGE ROM ARCHITECTURE

(75) Inventors: Vineet Kumar Sachan, Ghaziabad (IN);
Amit Khanuja, New Delhi (IN);
Deepak Sabharwal, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 248 days.

(21) Appl. No.: 12/346,862

(22) Filed: Dec. 31, 2008

(51) Int. Cl.
*G11C 7/00* (2006.01)

(52) U.S. Cl. .................... 365/196; 365/185.21; 365/205; 365/207

(58) Field of Classification Search ............. 365/185.21, 365/196, 205, 207
See application file for complete search history.

(56) References Cited

U.S. PATENT DOCUMENTS

2003/0189851 A1* 10/2003 Brandenberger et al. ..... 365/200

* cited by examiner

*Primary Examiner* — Jason Lappas
(74) *Attorney, Agent, or Firm* — Kanika Radhakrishnan; Evergreen Valley Law Group, P.C.

(57) ABSTRACT

Read only memory (ROM) with minimum leakage is provided. The ROM includes a read only memory array. The read only memory array includes a first transistor, wherein a drain, a source, a gate, and a bulk of the first transistor is electrically connected to a logic zero in the idle state for ensuring zero junction and sub-threshold leakage current. Another ROM includes a first transistor comprising a gate, electrically connected to a word line to provide a read signal, a drain, electrically connected to a main bit line through a second transistor. The second transistor includes a gate, electrically connected to a first decoding circuit, a drain, electrically connected to the main bit line. A first reference bit line is electrically connected to a drain of a third transistor, wherein gate of the third transistor is electrically connected to a second decoding circuit for generating a stop read signal. A second reference bit line, electrically connected to the first decoding circuit through a first sensing unit for generating a stop precharge signal. Further, a reference word line is electrically connected to a gate of a fourth transistor.

13 Claims, 2 Drawing Sheets

LOW LEAKAGE ROM ARCHITECTURE

FIELD

The present disclosure in general relates to a read only memory architecture and in particular relates to a read only memory with minimum leakage current.

BACKGROUND

Often, in a read only memory (ROM) architecture an N-MOS transistor is used. The gate of the transistor is connected to a word line, the drain of the transistor is connected to a bit line and the source of the transistor is grounded. The bit line is charged to the highest potential even in the idle state. Hence there exists a leakage current due to the voltage drop between the drain and the source of the transistor.

The leakage current is experienced even when the gate of the read only memory transistor is at a logical zero or in other words, in the idle state. In large ROMs the leakage from the ROM array is of a very high magnitude and a dominant component of the total ROM leakage.

The leakage current may be reduced by using a transistor with the source of the transistor virtually grounded. The leakage current may be reduced by using a virtual ground at the source of the transistor. However in such a method, there still exists voltage potential between the source and bulk junction and drain and bulk junction. The source and bulk and drain and bulk junctions contribute junction leakage. In very large ROMs having high number of cells the junction leakage is of large magnitude and a dominant component of the total ROM leakage.

The leakage current may be reduced using a P-MOS architecture. The solution of using P-MOS may result in either a very slow ROM because of the inherent slow nature of P-MOS or a very large ROM if the P-MOS current is increased by increasing its size. The existing ROM architecture standards may not allow the usage of P-MOS architecture.

In light of the forgoing discussion, there is an unmet need for a ROM architecture with minimum leakage drop.

SUMMARY

Embodiments of the invention described herein provide a method and a system to minimize leakage current in a read only memory.

An example read only memory for minimizing leakage current includes a read only memory array. The read only memory array includes a first transistor, wherein a drain, a source, a gate, and a bulk of the first transistor is electrically connected to a logic zero in the idle state for ensuring zero junction and sub-threshold leakage current.

Another example read only memory for minimizing leakage current includes a first transistor including a gate, a drain, and a source. The gate of the first transistor is electrically connected to a word line to provide a read signal. The drain of the first transistor is electrically connected to a main bit line through a second transistor, and the source of the first transistor is electrically grounded. The second transistor includes a gate, a drain and a source. The gate of the second transistor is electrically connected to a first decoding circuit. The drain of the second transistor is electrically connected to the main bit line, and the source of the second transistor is electrically connected to a power supply. A first reference bit line is electrically connected to a drain of a third transistor, wherein gate of the third transistor is electrically connected to a second decoding circuit for generating a stop read signal. Further, a second reference bit line is electrically connected to the first decoding circuit through a first sensing unit for generating a stop pre-charge signal. Furthermore, a reference word line is electrically connected to a gate of a fourth transistor.

An example method includes pre-charging a main bit line connected to the drain of a first transistor through a second transistor, a first reference bit line and a second reference bit line. The second reference bit line is used to provide a stop pre-charge signal. The method also includes providing read signal to a word line of a gate of the first transistor and providing read signal to a reference word line at the gate of a fourth transistor. Further, the method includes discharging the first reference bit line through a third sensing unit to provide a stop read signal to the main bit line.

DETAILED DESCRIPTION OF THE EMBODIMENTS

Embodiments of the invention provide a method and a system to minimize leakage in read only memory (ROM) device. An example ROM circuit includes the read only memory array. The read only memory array includes a transistor with a gate, a drain, and a source and a bulk node. The gate of the transistor is electrically connected to a word line to provide a read signal. The drain of the transistor is connected to the bit line. The source and bulk of the transistor is connected to ground. In the idle state the gate of the transistor is held at a logic low. The bit line is also held at a logic low in the idle state. This ensures all four junctions of the transistor, namely gate, drain, source and bulk are held at the same potential in the idle state ensuring absolutely zero leakage current in the read only memory array. Further, the ROM circuit includes a circuit for pre-charging the bit-line. The pre-charging circuit includes one or more transistors. Further, the ROM includes one or more reference bit lines for controlling the pre-charging and read operation of the ROM and one or more sensing units for generating the signals for controlling the pre-charging and the read operation.

Figure 1:
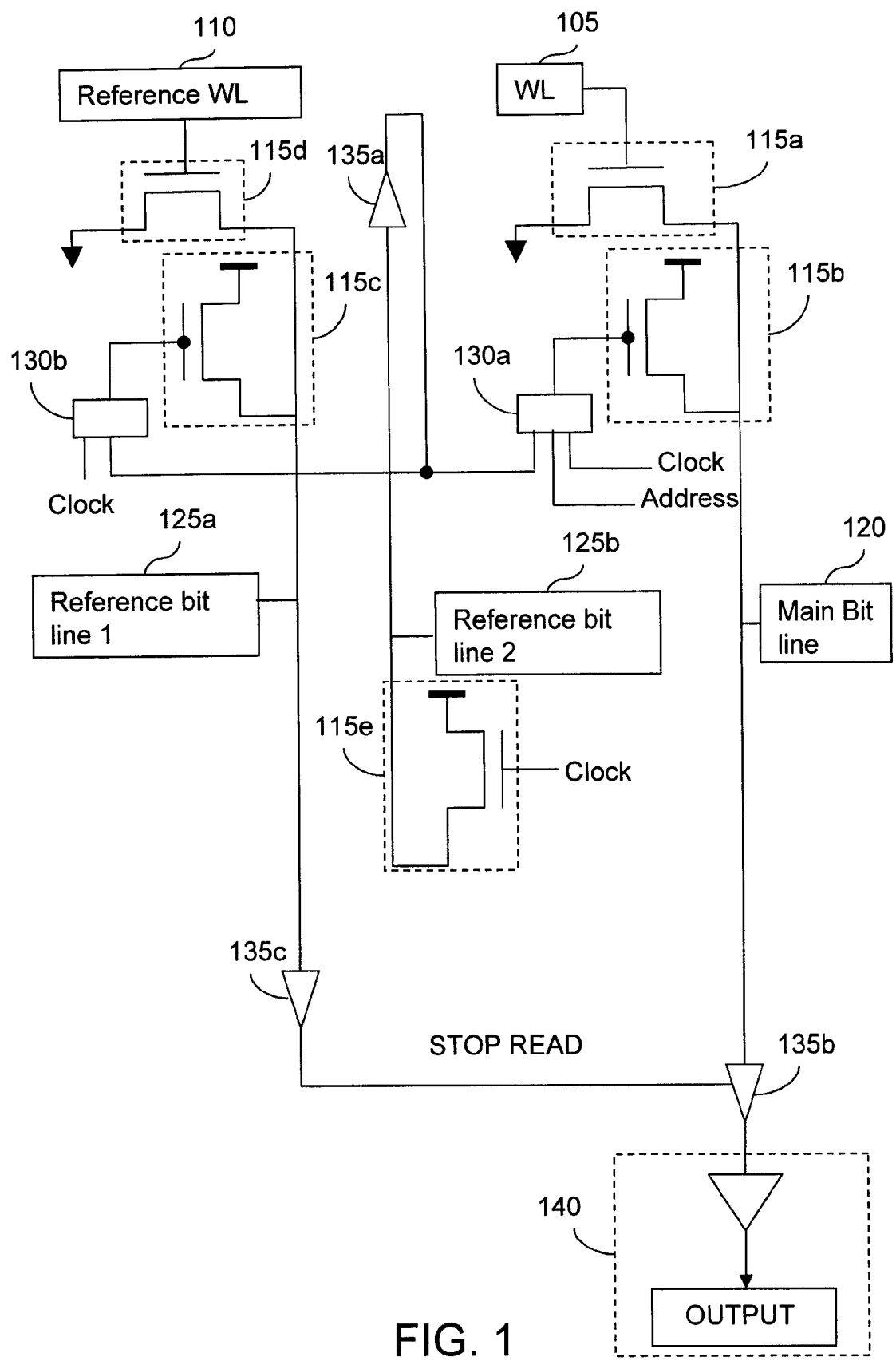
FIG. 1 illustrates a read only memory for minimizing leakage current in accordance with an embodiment of the invention.

FIG. 1 is a read only memory (ROM) 100 in accordance with an embodiment of the invention. The ROM 100 includes a ROM transistor 115a, herein referred to as a first transistor 115a, a second transistor 115b, a third transistor 115c, a fourth transistor 115d and a fifth transistor 115e. The first transistor 115a, the second transistor 115b, the third transistor 115c, the fourth transistor 115d and the fifth transistor 115e may be one of a PMOS transistor and a NMOS transistor. The ROM further includes a main bit line 120 connected to a drain of the second transistor 115b. A first reference bit line 125a is connected to the drain of the third transistor 115c. A second reference bit line 125b is connected to the drain of the fifth transistor 115e. An output of a first decoding circuit 130a is connected to a gate of the second transistor 115b and an output of a second decoding circuit 130b is connected to the gate of the third transistor 115c. An input of a first sensing unit 135a is connected to the drain of the fifth transistor 115e. An input of a second sensing unit 135b is connected to the main bit line 120. An input of a third sensing unit 135c is connected to the first reference bit line 125a. Furthermore, an output driver circuit 140 is connected to the second sensing unit 135b.

A word line 105 is connected to the gate of the first transistor 115a and a reference word line 110 is connected to the gate of the fourth transistor 115d. The drain of the first transistor 115a is connected to the main bit line 120 through the second transistor 115b and the source of the second transistor 115b is connected to a power supply. The main bit line 120 is used for accessing data from a memory. The data can be accessed by giving an input address to the word line 105. The second transistor 115b is used for pre-charging the main bit line 120 at every read cycle.

The first sensing unit 135a is used to control the pre-charging of the main bit line 120 and the first reference bit line 125a. The third sensing unit 135c is used for controlling the read operation of the memory.

The first decoding circuit 130a and the second decoding circuit 130b are used to control the operation of the second transistor 115b and third transistor 115c respectively. The first decoding circuit 130a receives at least one of a clock signal, an address and a signal from the first sensing unit 135a. The second decoding circuit 130b receives at least one of a clock signal and the signal from the first sensing unit 135a.

The second reference bit line 125b tracks the main bit line 120 and the first reference bit line 125a pre-charge operation. The main bit line pre-charge operation is tracked by the second reference bit line 125b using the first sensing circuit 135a, the first decoding circuit 130a and the second transistor 115b. The first reference bit line 125a pre-charge operation is tracked by the second reference bit line 125b using the second decoding circuit 130b and the third transistor 115c. The second reference bit line 125b starts from a logic low and is charged to logic high by fifth transistor 115e. The transistor 115e is controlled by the clock signal. Upon the clock being triggered, the transistor 115e switches on and starts pre-charging the second reference bit line 125b. The first sensing unit 135a trip as the second reference bit line 125b charges to a pre-defined level, and generates a stop pre-charge signal. The stop pre-charge signal switches-off the pre-charging of the main bit line 120 using the first decoding circuit 130a and the second transistor 115b, and the first reference bit line 125a using the second decoding circuit 130b and the third transistor 115c.

The first reference bit line 125a tracks the read operation of the main bit line 120 using the third sensing circuit 135c. The first reference bit line 125a starts from a logic low level and is charged to logic high by the third transistor 115c at every read cycle. The third transistor 115c is switched-on by the second decoding circuit 130b. The clock signal is used to switch-on the third transistor 115c Upon the first reference bit line 125a pre-charging to logic high, the stop pre-charge signal, generated by the first sensing circuit is used to switch-off the third transistor 115c. The third transistor 115c operates in every clock cycle irrespective of the input address. Upon the third transistor 115c being switched-off by the stop the pre-charge signal, the reference word line 110 is turned-on. The first reference bit line 125a is coupled to the drain of the fourth transistor 115d and hence starts discharging. The third sensing unit 135c trips as the first reference bit line 125a discharges to a predefined level and a stop read signal is generated. The stop read signal triggers the sensing unit 135b. The reference bit line 125a is pulled back to logic low at the end of the read cycle.

Figure 2:
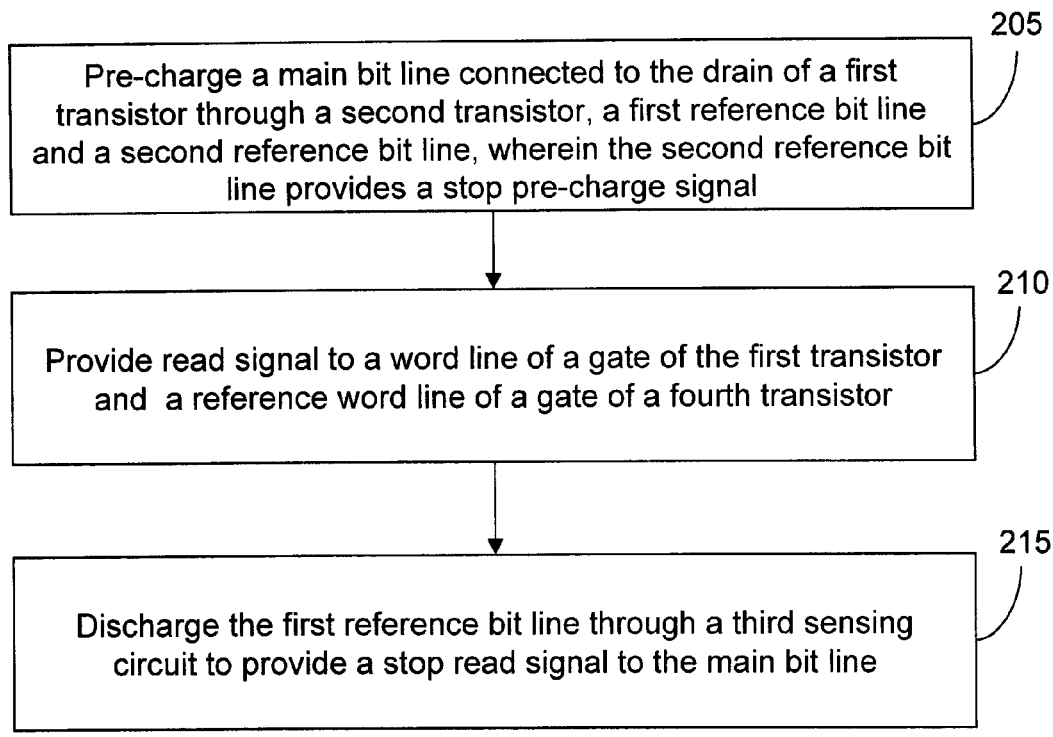
FIG. 2 illustrates a method for minimizing leakage in read only memory in accordance with an embodiment of the invention.

FIG. 2 is a flowchart illustrating a method for minimizing leakage in the ROM.

At step 205, the main bit line, connected to the drain of a first transistor is pre-charged through a second transistor. A first reference bit line and a second reference bit line is also pre-charged simultaneously using a third transistor and a fifth transistor respectively. The second reference bit line is used to provide a stop pre-charge signal.

In an embodiment of the invention, the main bit line, the first reference bit line and the second reference bit line are initially set at a ground level. A memory includes multiple columns. The columns include multiple bit lines. When a read operation is performed on the main bit line, the main bit line need to be pre-charged to a maximum voltage "VDD". The pre-charging operation may take place for a predefined time. Further, the pre-charging operation may also include pre-charging a bit line from multiple columns in a memory based on the address of the memory.

At step 210, a read signal is provided to a word line of a gate of the first transistor and a reference word line of a gate of a fourth transistor. The main bit line, the first reference bit line and the second reference bit line, are pre-charged to a maximum voltage of the read only memory. The second reference bit line detects the pre-charging of the main bit line and generates a stop pre-charge signal. The main bit line starts to discharge based on the stop-pre-charge signal. The input to the word line is based on the stop pre-charge signal. In one embodiment the discharging of the main bit line is based on the input to the word line.

The second reference bit line is pre-charged using the fifth transistor based on the clock signal. A first sensing unit connected to the second reference bit line trips upon the reference bit line charging to a predefined level and generates the stop pre-charge signal. The stop pre-charge signal, the clock and the address is given as the input to a first decoding circuit. Upon receiving the stop pre-charge signal the first decoding circuit gives an input signal to the second transistor. The second transistor switches-off and the pre-charging stops.

The stop pre-charge signal and clock are given as input to the first reference bit line. A second decoding circuit gives an input signal to the third transistor and the pre-charging of the first reference bit line stops.

Upon stopping the pre-charging operation of the main bit line and the reference bit line, the word line is enabled. The reference word line is kept enabled over the entire read cycle.

At step 215, the first reference bit line discharges through a third sensing unit to provide a stop read signal to the main bit line. The main bit line will then evaluate the read only memory cell contents given that the word line is switched on. It will discharge if the read only memory cell is programmed to one particular state ("0"/"1") and maintain its level for the other particular state ("1"/"0").

The main bit line evaluates the read only memory cell contents and trips a second sensing unit. An output driver circuit controls and operates the second sensing unit.

The fourth transistor is always programmed to allow the first reference bit line to discharge. As soon as the Reference WL is asserted the fourth transistor couples the first reference bit line to ground and the first reference bit line starts discharging. The third sensing unit trips based on the discharging of the first reference bit line to a predefined level. A stop read signal is generated by the third sensing unit. The stop read signal is given to the output driver circuit. The stop read signal disables the word line resulting in the removal of the voltage difference between the source and the drain of the first transistor. Hence, the read operation is completed.

The sensing units may be an inverter circuit for inverting the voltages fed to its input.

In an embodiment of the invention, one or more steps of the method described in FIG. 2 may be implemented using a machine-readable medium product.

While embodiments of the invention are disclosed in terms of exemplary embodiments, it can be practiced in a number of ways as defined by the scope of the appended claims. Additionally, various features of embodiments of the invention can be modified in a myriad of ways to achieve the goal of powering an electronic device.

What is claimed is:

1. A read only memory comprising:
    a first transistor comprising a gate, a drain, and a source, the gate of the first transistor directly connected to a word line to provide a read signal, the drain of the first transistor directly connected to a main bit line through a second transistor, and the source of the first transistor is electrically grounded;
    the second transistor comprising a gate, a drain and a source, the gate of the second transistor is directly connected to a first decoding circuit, the drain of the second transistor is directly connected to the main bit line, and the source of the second transistor is directly connected to a power supply;
    a first reference bit line directly connected to a drain of a third transistor, wherein gate of the third transistor is directly connected to a second decoding circuit to generate a stop read signal;
    a second reference bit line directly connected to the first decoding circuit through a first sensing unit for generating a stop pre-charge signal; and
    a reference word line directly connected to a gate of a fourth transistor.

2. The read only memory of claim 1, wherein a source of the third transistor is electrically connected to the power supply.

3. The read only memory of claim 1, wherein a source of the fourth transistor is electrically grounded.

4. The read only memory of claim 1, further comprising a fifth transistor, wherein the fifth transistor comprises a gate, a drain and a source, the gate electrically connected to a clock, the drain electrically connected to the second reference bit line, and the source electrically connected to the power supply.

5. The read only memory of claim 4, wherein the clock is electrically connected to the first decoding circuit and the second decoding circuit.

6. The read only memory of claim 1 further comprising a second sensing unit for sensing charging and discharging of the main bit line.

7. The read only memory of claim 6, wherein the second sensing unit comprises an inverter circuit.

8. The read only memory of claim 1 further comprising a third sensing circuit for sensing charging and discharging of the second reference bit line.

9. The read only memory of claim 1 further comprising an output driver to drive the output of the second sensing unit.

10. A method for minimizing leakage current in a read only memory, the method comprising:
    connecting a drain of a first transistor to a main bit line through a second transistor;
    pre-charging the main bit line through the second transistor, a first reference bit line and a second reference bit line, wherein the second reference bit line provides a stop pre-charge signal;
    connecting a gate of the first transistor directly to a word line;
    connecting a gate of a fourth transistor directly to a reference word line;
    providing a read signal to the gate of the first transistor through the word line and to the gate of the fourth transistor through the reference word line; and
    discharging the first reference bit line through a third sensing unit to provide a stop read signal to the main bit line.

11. The method of claim 10 wherein the stop-precharge signal is provided through a first decoding circuit that receives a clocking signal and an address.

12. The method of claim 10 wherein the stop-read signal is provided through a second decoding circuit that receives the clocking signal and the stop-precharge signal.

13. The method of claim 10 wherein the stop-precharge signal is provided through a sense unit electrically connected to a transistor that receives the clocking signal.

* * * * *